(12) United States Patent
Cernea

(10) Patent No.: US 7,549,012 B2
(45) Date of Patent: *Jun. 16, 2009

(54) MEMORY DEVICE WITH SECTOR POINTER STRUCTURE

(75) Inventor: Raul-Adrian Cernea, Santa Clara, CA (US)

(73) Assignee: SanDisk Corporation, Milpitas, CA (US)

( * ) Notice: Subject to any disclaimer, the term of this patent is extended or adjusted under 35 U.S.C. 154(b) by 170 days.

This patent is subject to a terminal disclaimer.

(21) Appl. No.: 11/009,439

(22) Filed: Dec. 9, 2004

(65) Prior Publication Data
US 2005/0120266 A1 Jun. 2, 2005

Related U.S. Application Data

(63) Continuation of application No. 10/071,795, filed on Feb. 6, 2002, now Pat. No. 6,839,826.

(51) Int. Cl.
*G06F 12/06* (2006.01)

(52) U.S. Cl. ........................... 711/103; 711/206

(58) Field of Classification Search .......... None
See application file for complete search history.

(56) References Cited

U.S. PATENT DOCUMENTS

| 4,630,086 A | 12/1986 | Sato et al. |
| 4,733,394 A | 3/1988 | Giebel |
| 5,602,987 A | 2/1997 | Harari et al. |
| 5,627,783 A | 5/1997 | Miyauchi |

(Continued)

FOREIGN PATENT DOCUMENTS

EP 1139210 A1 3/2000

(Continued)

OTHER PUBLICATIONS

International Search Report mailed May 30, 2003.

(Continued)

*Primary Examiner*—Than Nguyen
(74) *Attorney, Agent, or Firm*—Davis Wright Tremaine LLP

(57) ABSTRACT

A pointer structure on the storage unit of a non-volatile memory maintains a correspondence between the physical and logical address. The controller and storage unit transfer data on the basis of logical sector addresses with the conversion between the physical and logical addresses being performed on the storage unit. The pointer contains a correspondence between a logical sector address and the physical address of current data as well as maintaining one or more previous correspondences between the logical address and the physical addresses at which old data is stored. New and old data can be kept in parallel up to a certain point. When combined with background erase, performance is improved. In an exemplary embodiment, the pointer structure is one or more independent non-volatile sub-arrays, each with its own row decoder. Each pointer has a flag to indicate if it is active in addition to storing the current correspondence between a logical address and a physical address and one or more previous correspondences. When new data is written, it is written to an available, empty memory sector and the pointer is concurrently updated. Defective sectors can be removed from the pool of available sectors in a row redundancy scheme. A random, binary, or other search technique can be used to find the available erased sectors.

10 Claims, 3 Drawing Sheets

U.S. PATENT DOCUMENTS

| | | | |
|---|---|---|---|
| 5,652,860 A * | 7/1997 | Sato | 711/154 |
| 5,740,396 A | 4/1998 | Mason | |
| 5,768,192 A | 6/1998 | Eitan | |
| 5,845,313 A | 12/1998 | Estakhri et al. | |
| 5,892,706 A | 4/1999 | Shimizu et al. | |
| 5,905,993 A | 5/1999 | Shinohara | |
| 5,907,856 A | 5/1999 | Estakhri et al. | |
| 5,946,714 A | 8/1999 | Miyauchi | |
| 5,963,983 A | 10/1999 | Sakakura et al. | |
| 5,991,193 A | 11/1999 | Gallagher et al. | |
| 6,034,897 A | 3/2000 | Estakhri et al. | |
| 6,046,935 A | 4/2000 | Takeuchi et al. | |
| 6,108,759 A | 8/2000 | Orcutt et al. | |
| 6,122,195 A | 9/2000 | Estakhri et al. | |
| 6,128,695 A * | 10/2000 | Estakhri et al. | 711/103 |
| 6,134,151 A | 10/2000 | Estakhri et al. | |
| 6,141,249 A | 10/2000 | Estakhri et al. | |
| 6,145,051 A | 11/2000 | Estakhri et al. | |
| 6,151,247 A | 11/2000 | Estakhri et al. | |
| 6,385,690 B1 * | 5/2002 | Iida et al. | 711/103 |
| 6,411,546 B1 | 6/2002 | Estakhri et al. | |
| 6,426,893 B1 * | 7/2002 | Conley et al. | 365/185.11 |
| 6,618,789 B1 * | 9/2003 | Okaue et al. | 711/103 |
| 6,772,274 B1 * | 8/2004 | Estakhri | 711/103 |
| 6,839,826 B2 * | 1/2005 | Cernea | 711/202 |

FOREIGN PATENT DOCUMENTS

| | | |
|---|---|---|
| JP | H07-182879 | 7/1995 |
| JP | 2000-510634 | 8/2000 |
| JP | 2001-210082 | 8/2001 |
| JP | 2002-508862 | 3/2002 |
| WO | WO 98/44420 | 10/1998 |

OTHER PUBLICATIONS

People's Republic of China Office Action for Patent Application No. 03803347.X for SanDisk Corporation, mailed Feb. 6, 2006, 8 pages.

Supplementary European Search Report for SanDisk Corporation, Application No. 03 737 638.1, mailed May 18, 2007, 1 page.

Examiner's First Report for SanDisk Corporation, Application No. 03 737 638.1, mailed Apr. 30, 2008, 4 pages.

Notification of Reasons for Refusal, Japanese Patent Application No. 2003-566720, mailed Dec. 15, 2008, 7 pages.

* cited by examiner

Fig. 3f

MEMORY DEVICE WITH SECTOR POINTER STRUCTURE

This application is continuation of application Ser. No. 10/071,795, filed on Feb. 6, 2002 now U.S. Pat. No. 6,839,826.

FIELD OF THE INVENTION

The present invention relates to nonvolatile memories and more specifically, techniques for reading data for these types of memories through use of a pointer structure to maintain a correspondence between logical and physical addresses on the memory storage unit.

BACKGROUND OF THE INVENTION

The principles of the present invention have application to various types of non-volatile memories, those currently existing and those contemplated to use new technology being developed. Implementations of the present invention, however, are described with respect to a flash electrically-erasable and programmable read-only memory (EEPROM), wherein the storage elements are floating gates.

Such non-volatile memory systems typically include one integrated circuit chip that includes the controller and one or more integrated circuit chips that each contain a memory array and associated control, input/output and state machine circuits. The trend, of course, is to integrate the memory array and controller circuits of a system together on one or more integrated circuit chips. The memory system may be embedded as part of the host system, or may be included in a memory card that is removably insertable into a mating socket of host systems. Such a card may include the entire memory system, or the controller and memory array, with associated peripheral circuits, may be provided in separate cards.

The memory system communicates with its host through use of logical addresses by which data are identified. The data are stored on the array at a physical location identified by a physical address. Although the physical and logical addresses can be the same, a distinction is commonly made between these so that the physical address identified with a logical address can be changed for reasons of, for example, defect management or wear leveling. Examples of such defect management are given, for example, in U.S. Pat. No. 5,602,987, which is hereby incorporated by reference and which describes the remapping of the memory on both a cell and a sector level, where a sector is size of the data transfer unit to and from the host.

The correspondence between the logical and physical addresses needs to be maintained by the system so that the conversion can be performed, usually on the controller or, occasionally, on by the host (for example in an embedded embodiment of a Flash array). The map itself may be maintained in the memory array, but is usually loaded (at power up or as needed) into a volatile pointer structure or table on the controller (or host) where the logical to physical identification and conversion takes. Thus, the storage unit itself works in the physical address space; although the host may communicate with the memory using logical addresses, these are converted by the controller to physical addresses in order to communicate with the storage portion.

When data is written into a non-volatile memory, it is common to erase the data previously associated with the corresponding logical address before writing the new data into the corresponding physical address. The old data is not accessible as the old data, old pointers, or both are not maintained. Consequently, if a write is unsuccessful, the old data may be lost. In one set of prior art approaches, new data are temporarily written data in different locations other than the corresponding physical location.

SUMMARY OF THE INVENTION

Therefore, according to one primary aspect of the present invention, the logical and physical addresses are not identical. A pointer structure on the storage unit of the non-volatile memory maintains the correspondence between the physical and logical address. The controller and storage unit transfer data on the basis of logical sector addresses with the conversion between the physical and logical addresses being performed on the storage unit. The pointer contains a correspondence between a logical sector address and the physical address of current data as well as maintaining one or more previous correspondences between the logical address and the physical addresses at which old data is stored. New and old data can be kept in parallel up to a certain point. When combined with background erase, performance is improved.

In an exemplary embodiment, the pointer structure is one or more independent non-volatile sub-arrays, each with its own row decoder. The use of multiple pointers increases reliability. Each pointer has a flag to indicate if it is active in addition to storing the current correspondence between a logical address and a physical address and one or more previous correspondences. When new data is written, it is written to an available, empty memory sector and the pointer is concurrently updated. Defective sectors can be removed from the pool of available sectors in a row redundancy scheme. A random, binary, or other search technique can be used to find the available erased sectors.

Additional aspects, features and advantages of the present invention are included in the following description of exemplary embodiments, which description should be taken in conjunction with the accompanying drawings.

BRIEF DESCRIPTION OF THE DRAWINGS

FIGS. 3a-f show an exemplary operation sequence for the embodiment of FIG. 2.

DESCRIPTION OF EXEMPLARY EMBODIMENTS

The present invention presents a non-volatile memory that maintains in a pointer structure the correspondence between the physical addresses in the array and logical addresses from the host. The pointer structure is on the non-volatile memory array structure and is transparent to the memory controller, which deals only in the logical addresses. In a write process, the new data and its corresponding logical address are supplied to the memory array by the controller. The new data is written into a new physical address and the correspondence between the logical and new physical addresses is updated in pointer structure of the array, which also maintains the correspondence between the previous physical address and the logical address. The previous data can also be maintained in the previous physical sector subsequent to, and in parallel with, the new data being written and can be erased later as part of a background process. In a read process, the logical address of the data is supplied by the controller to the memory array, which returns the data from the corresponding physical address to the controller.

In the description below, the invention is discussed mainly in terms of an embodiment having distinct controller and memory chips for convenience, although in other embodiments these may be combined on a single integrated circuit. Also, to simplify the discussion below, the unit of both writing and erasing for data is taken as a sector and corresponds to a row of the memory array, although more generally the structure will not necessarily correspond. More detail on memory structures where the present invention may be used are described in U.S. patent application Ser. No. 09/893,277, filed Jun. 27, 2001, by Jian Chen et al. and entitled "Operating Techniques for Reducing Effects of Coupling Between Storage Elements of a Non-Volatile Memory Operated in Multiple Data States"; Ser. No. 09/505,555, filed Feb. 17, 2000, by Kevin Conley et al. and entitled "Flash EEprom System with Simultaneous Multiple Data Sector Programming and Storage of Physical Block Characteristics in Other Designated Blocks"; and Ser. No. 09/703,083, filed Oct. 31, 2000, by John S. Mangan et al. and entitled "Variable Bit Line Ramp Rate Control For Flash Memories", which are all hereby incorporated by reference, and references contained therein.

Free Addressing in a Non-Volatile Memory

In a flash memory array of X rows and Y columns there could be an advantage to use a free addressing scheme, i.e., to allow information to be written at a physical address that is different from the logic one. An exemplary embodiment is described with respect to FIG. 1. Although the present invention is described mainly in terms of a Flash memory, it readily extends to other non-volatile storage units, since the particulars of how data are stored, read, and written into the storage units do not enter into the following discussion to any great degree.

Figure 1:
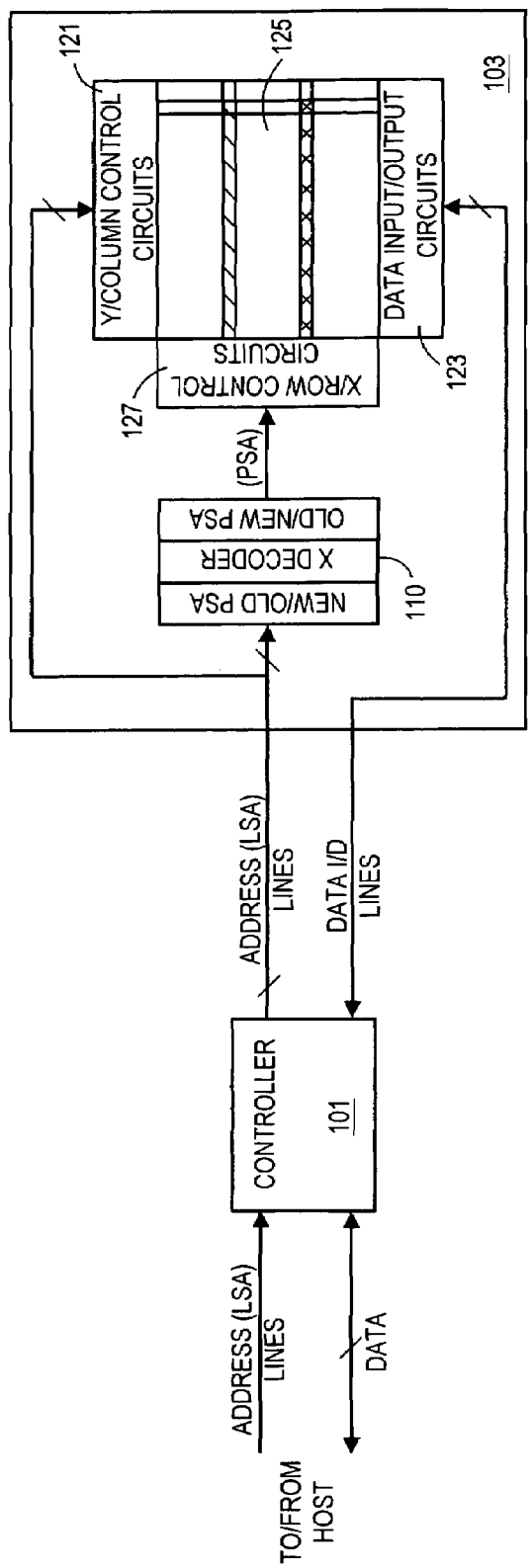
FIG. 1 is a block diagram of a portion of a non-volatile memory implementing aspects of the present invention.

FIG. 1 is a block diagram of a portion of a non-volatile memory having a memory controller 101 and memory circuit 103, here on separate integrated circuits, connected to exchange data, addresses, and commands. The controller 101 is in turn also connected to a host system (not shown) to exchange data, addresses, and commands. The memory circuit 103 is shown to include an array 125 of non-volatile memory cells to which are connected a Y or column control circuit 121, an X or row column control circuit 127, and data input/output circuits 123. More detail on these read, write and erase circuits is given in U.S. Pat. No. 5,602,987 and other incorporated references. To simplify the discussion, this example considers the memory array as having one continuous control gate and/or one continuous erase gate along the word line. The data storage units may store binary or, preferably, multi-state memory cells. More general cases can be developed as described in patent application Ser. Nos. 09/893,277 and 09/505,555 incorporated by reference above.

Rather than supply the physical sector address (PSA) via the interface from the controller to the X or row column control circuit 127, the logical sector address (LSA) is instead supplied through the interface to the memory circuit 103 where it is converted into a corresponding physical sector address. For this purpose, the memory circuit also includes a pointer structure using a separate mini array 110 with its own X decoder. A simplified example is shown in FIG. 2.

Figure 2:
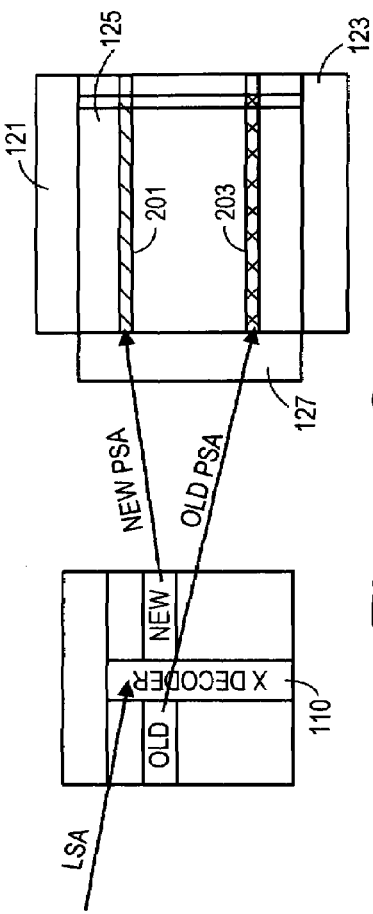
FIG. 2 shows a simplified example of a pointer structure using a separate mini array.

FIG. 2 shows a pointer structure that constitutes the Sector Allocation Table where the old, or previous, and the new, or current, physical addresses of a certain logic address are stored concurrently; that is, when new data are written into a logical address (LSA), they are written into a different physical address (PSA) than the physical address that previously corresponded to the logical address and this previous correspondence is maintained in the pointer structure after it has been updated. The current data are shown in the memory array schematically as the portion 201 and the data previously corresponding to the logical address is shown as portion 203, where here each portion is taken as a sector, the unit of erase.

While the main array 125 may have thousand of cells across the word line, the pointer array 110 has just a few bits along its word line, their number here being twice the number of the row address bits. At a certain time the old and the new address pointers coexist. The same thing happens with the information stored at the corresponding positions, with old data 203 at the old address and new data 210 at the new address. Prior to the regular read, a fast access to the pointer structure's X decoder, which is at the logical address, provides the pointer to the current, or new, word line. Following that, the pointed at word line is selected (physical address corresponding to the logical address). This sequence is necessary only during the read operation; because the access time is less than the time required to stream out data, this preliminary procedure has no impact on the read performance. During the write or erase operation, such extra step is not needed.

As the old data is maintained for some time after the new data is written, it can be accessed until it is erased. Upon special command, the old address row can also be accessed if desired. This provides a "make before break" feature, whereby if some error occurs while writing the new data or the previous data is wanted for any other reason, it is still in the non-volatile memory and may still be accessed. In addition to accessing the old data by using the previous correspondence of the logical address, it can also be accessed directly by a physical address mode, although this would generally not be available directly to the user.

When writing, array data and the address pointer can be programmed at the same time. Pending program verify, old data at the old physical address are available. As the new data corresponding to a logical address is not written at the same physical address, writing new word lines (or however the write unit is arranged) does not require erase operation before the entire memory array is full. However, at sector allocation table (SAT) level, the old address pointer has to be erased and made available for the next writing operation of that particular logic address. When writing huge blocks of data, when performance is meaningful and desired, erasing old pointers is not a stringent requirement. But, when repeatedly writing the same logic address, pointer erase degrades performance. Nevertheless, in this case, in order to alleviate the impact of the pointer space clean up time upon the write performance, a buffer can be used.

The number of cells necessary to store an address is small when compared to the number of cells along the main array write unit, here taken as a word line. For example, with 16K rows, 14 bits are necessary, or about 1/1000 overhead on a 16K cell word line. Keeping this in mind, a 10× buffer can be used, at only 1% overhead. In this case, erasing the pointer buffer will occur only after 10 writing cycles, such that the erase time is somehow amortized. The main array itself needs to be erased only when is full. To improve performance, erase units can be erased in a background process. More detail on the erase process and the finding of an available write unit is given below in the "Algorithm for Finding Erased Sectors" section.

Within an array, information about empty write unit, a row in this example, availability can be stored attached to the write unit itself, in this case on a single word line such that (horizontally) every memory cell keeps track of one row. This allows the invention to keep track of bad write units. Within the example of FIGS. 1 and 2, the process will be described schematically with respect to FIGS. 3a-3f.

In these figures, the pointer structure 110 is schematically shown to have an X-decoder 303 where the logical address are kept, a first set of corresponding physical addresses 301, and a second set of physical addresses 305. (The cells 301 and 305 of the pointer 110 are here shown as being respectively to the left and right of decoder 303, but can both be on the same side in the actual layout, as in the "Pointer Structure" section below.) In this example, there are eight possible physical sector addresses and the number of logical addresses will be eight less the number of bad rows. The logical address are shown running down the pointer's X-decoder from 1 to the number of good rows.

In the data array, X-decoder 127 shows the physical address of the rows as running from 1-8. The array 125 contains these eight rows of user data memory cells as well as two columns 321 and 323 of flags (two for each row) to serve as a sector chart.

Figures 3A, 3B, 3C, 3D, 3E, 3F:
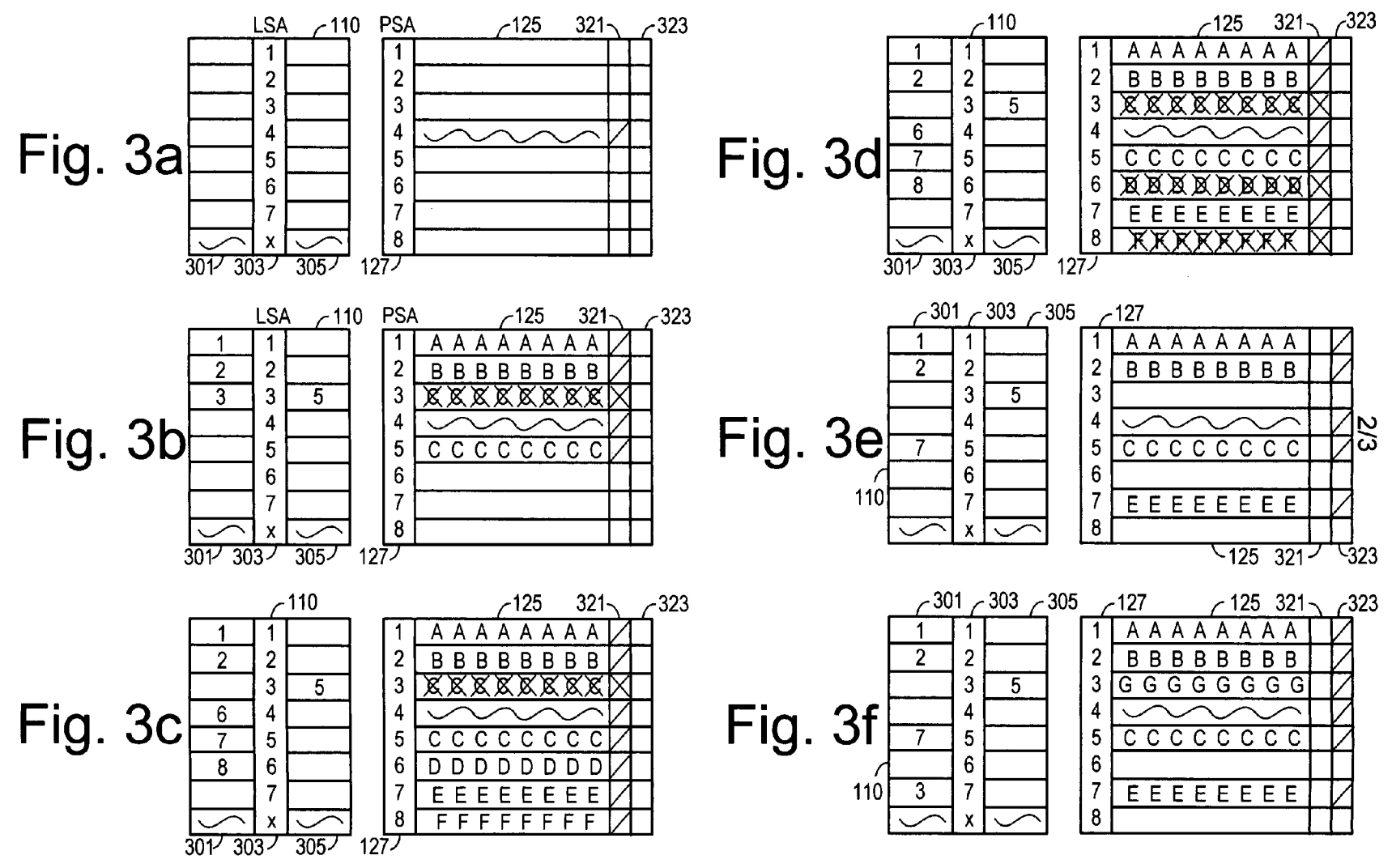

FIG. 3a shows a fresh or otherwise fully erased array. In the example, the array has one bad write unit, the sector with the fourth wordline that is shown marked out. Consequently, the logical addresses run from 1-7 and the last slot in 303 (would be logical address 8) is shown as an x and the corresponding slots in 301 and 305 are marked out to show the array has lost the one word line. That a wordline is bad can be determined at test as well as during later operation to update the pointer structure 110. Even when the memory is empty, the position in the sector chart at 321 is marked to indicate the fourth row is bad and not to be written to.

In the example, data A-C, corresponding respectively logical sector addresses 1-3 arrives at the memory and are respectively written into physical sector addresses 1-3. Subsequently, the data corresponding to logical sector 3 (the C data) is updated. Rather than write over the data in physical sector 3, the new C data is written into an empty sector. Since physical sector 4 is bad, the new C data is written into sector 5. (Although the physical sectors are being written in order in this example, this generally need not be the case and will not be the case once the array is partially written.) The situation at this point is shown in FIG. 3b.

In the pointer structure 110 for FIG. 3b, logical addresses 1 and 2 respectively correspond to physical sector addresses 1 and 2. Corresponding to logical sector 3 is the previous physical sector 3 in column 301 and the currently corresponding physical sector address 5 is in column 305. In array 125, the A (logical address 1) and B (logical address 2) data are in the first and second row. The old C (logical address 3) data are shown in row 3 as crossed out to indicate that it is not current, with the current C data in row 5. The status of the various rows are shown in column 321, with the single mark indicating that the row is not available to be written to and the x in row 3 indicating that row 3 has both been written to and is no longer current. At this stage, the logical address 3 is written twice as reflected in the two pointers for this logical address. Physical sector 3 can be erased as desired at this point, for instance in a background operation or else by just waiting until the array is full. The old pointer (physical address 3) corresponding to logical address 3 can also now be erased as desired.

Continuing on with writing additional data (respectively D-F) corresponding to logical addresses 4-6, rows 6-8 are filled. At this stage the memory is full (assuming row 3 has not been erased in a background process), and the old pointer of logical sector 3 can also have been cleaned out. The resultant situation is shown in FIG. 3c.

Finding available rows is implemented, first, by dumping the chart (321 and 323) in the Sense Amplifier registers (in the data output circuitry 123) and then streaming out the row status information, not necessarily outside the memory chip 103. At write time the chart is updated and only one or two bits need to be programmed. The chart has also two partitions, old and new, corresponding respectively to 321 and 323 at this stage, although their roles are reversed by FIG. 3f.

Continuing with the example, consider next that logical addresses 4 and 6 (data D and F) are now taken to be obsolete as shown by the data in the corresponding physical sectors being x'd out. Thus, as shown in FIG. 3d there are two more pointers to be erased (for logical addresses 4 and 6 in 301) and three word lines are available for erase.

In FIG. 3e, the obsolete sectors have been erased and pointer 110 cleaned up. Sector chart 321 has been erased and the updated sector chart is now in columns 323. When new data corresponding to logical address 7 (data G) arrives at the memory through its interface, it can be written into now free row 3, the result being shown in FIG. 3f. Thus, physical sector 3, that had previously corresponded to logical sector address 3, now corresponds to logical sector address 7.

It should again be noted that this process all occurs on the memory chip and will, except in special conditions such as physical address mode, be transparent to the controller. Externally, only the logical addresses and corresponding data are exchanged via the interface between the controller and memory chip, with the physical addresses being dealt with only on the memory chip.

Pointer Structure

A more detailed exemplary embodiment has an architecture including a pointer area split into two zones that are not physically adjacent, for example the leftmost and the rightmost area of the memory, each of which has its own X or row decoder. Each half has five distinct zones in the exemplary embodiment: A flag bit; a fuse address of X address size; a number of X addresses equal to the number of memory "planes"; an arbitrary number of full X+Y addresses; and a header space. The X address is the address within a plane and the Y address is the plane address. This pointer structure is presented with respect to FIG. 4.

Figure 4:
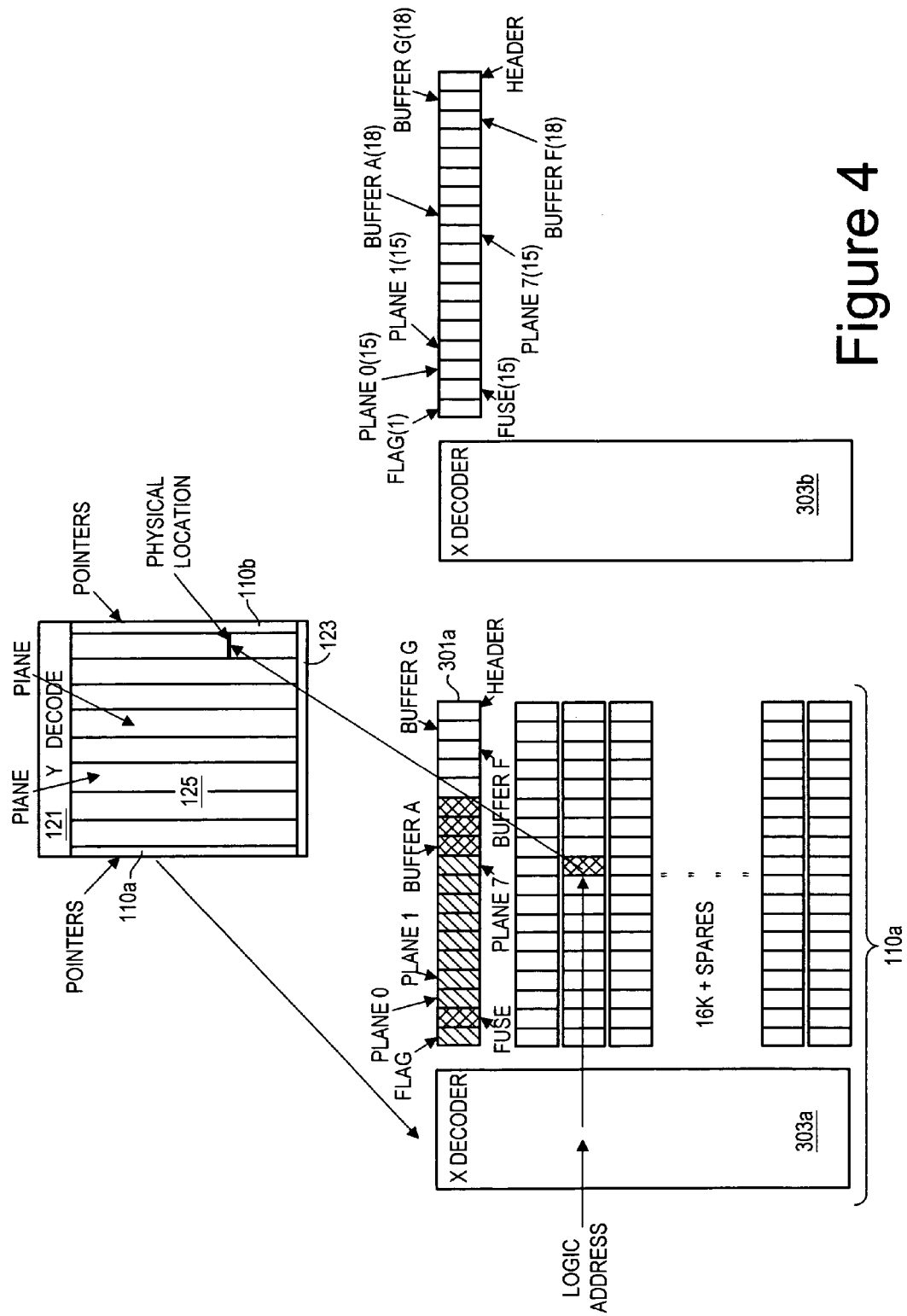
FIG. 4 is a memory array utilizing an exemplary embodiment of a pointer structure according to the present invention.

In FIG. 4, the memory array 125 is connected to a Y decoder circuit 121 and data input/output circuits 123. The array 125 is divided into, in this example, 8 planes as these are described in U.S. patent application Ser. Nos. 09/505,555 and 09/703,083 that are incorporated by reference above. The X decoders or row column control circuits for the planes are not shown explicitly in FIG. 4, but may be incorporated as described in these references. The left and right pointers 110a and 110b are shown in more detail and have their own distinct X decoders 303a and 303b shown explicitly. Given a certain logical X, or sector, address, its default pointer is located at the physical X address (or at a spare S address, described below) of the pointer space. By placing the pointer structures 110a and 110b on the different sides of the array, the chance of both arrays being bad due to processing problems or other random defects is minimized.

Only one of the half pointers 110a and 110b is active at a time, while the other is kept ready (erased). As shown in 301a, flag bit signals which half is active. A "0" flag bit (erased) makes that particular half inactive. Each half pointer has a fuse address that will declare the whole pointer as being bad, if the encoded address is S, or different from X. This information can be "fused" at "sort", during the testing performed before the device is shipped.

Within a good, active half pointer there are N X addresses (where N is the number of planes) that show the actual position of N sectors across the memory, one sector in each plane. In the particular case of eight planes, then eight X addresses can be sequenced to match eight plane positions and no Y (or "plane") address is required as it is implicit. This, combined with the header data, is the basic pointer structure. If the memory is always written in groups of 8 sectors located in the 8 planes in order, no buffer is necessary. Because this is not always the case, a certain number of full length X+Y address spaces with an explicit Y portion are dedicated to a pointer buffer. They are filled in each time a new sector that belongs to the X logical address is being programmed, regardless of the plane address that can now be taken out of order or "scrambled". The physical X location of a sector is determined by randomly or otherwise selecting an erased sector address that is already available on its corresponding plane. By adding a Y ("plane") address, sectors can be programmed in a scrambled, or out of plane order, sequence. Once the buffer is full, a cleaned up version of the basic structure (with the Y address repositioned to their implicit Y locations) is copied on the other half of the pointer, then the first half can be erased. The header information is transferred unchanged.

Whenever header information is updated, a full copy pointer operation is required. Although the storage units storing user data may be multi-state, information within pointer space is binary encoded (two state mode), providing the best data protection and the fastest write time. The header can include the standard information, such as ECC and other elements described in, for example, in U.S. Pat. No. 5,602, 987, which is incorporated by reference above.

A buffer is used for uneven cycling of sectors along a logic X address, with the worst case being repeatedly cycling the same sector. For a perfectly even sequence, i.e., the first sector is programmed first, then the second, then the third, etc., no buffer would be necessary.

By placing the pointer structure 110 on the memory chip, the pointer operation is geared towards higher memory autonomy, or minimal controller involvement (it is transparent). In a read operation, two modes are available, physical address access or logical address access. In logic address access, or the normal mode of operation, the X address is first loaded into the pointer address register. Then, both halves of the pointer of that particular row are read. If it turns out that the default pointer is bad ("fuse address" different from actual row address), a spare pointer (spare address S), with its address encoded at the fuse zone on the good half of the pointer is considered: being physically separated, the probability of both halves of a pointer being bad is so low, that such a die can be sorted out. Then a second pointer read follows. This is a maximum two step read operation that gives the true pointer.

The physical address access mode is not generally accessible to the user, by invoked by external command. This command could issued by the controller in case of system error. Alternately, the physical address mode could be used as part of a test mode during the sort process or to retrieve data if the part fails.

When any pointer is read, only the "flag=1" half is considered. At read time, only addresses are important; header bits are generally ignored.

First, the initial eight addresses (the N=8, pure X addresses) are assigned to the eight plane X decoders of the memory (loaded into their registers). Then, the first "buffer" address, if not empty, is read. It will provide a "plane" (Y) address and an X address. Accordingly, the X decoder register of that particular plane will be overridden and a new X address will be loaded. This is followed by the next "buffer" address, and so on. The X decoders are updated and only the latest entries remain in a process that represents a Y address descrambling. When assigning rows to the pointers in the physical domain, row 000 . . . 0 and 111 . . . 1 are skipped. Thus, any row in the buffer will have a non-zero address.

This whole sequence consists of very basic operations, such as checking for a "all 0's" (or all 1's) string of bits and/or moving data through shift registers. It can be very easily implemented "on chip", i.e., with no controller involvement.

The write operation is more involved, beginning with a preparation phase. The preparation phase involves two operations: finding the true pointer, the same as in the read mode, in parallel with finding erased sectors (one in each plane, if necessary). Updating the pointer follows next: depending on the circumstances, up to eight (in this particular example) X addresses are encoded in one cycle. At pointer programming time, if the number of sector addresses to be stored is greater than the number of empty "buffer" locations available on the active half, a clean version of the pointer is prepared for, and copied to, the other (erased) half of it. If the write operation to the planes is performed in the natural order of the basic pointer structure, the buffer portion (with the full X+Y address) is not needed. Otherwise, at a certain point the will eventually need to be cleaned up, as described above, which has a performance cost. In the case of performing the write process in sequence, performance is improved and the endurance of the pointer structure will be about the same as the user data portion of the array since it is erased less often.

The size of the buffer is based on the worst case scenario, which is to encode eight addresses without an erase operation being required. In this case, the size of the buffer is N−1, shown as Buffers A-G of 301a. For an array of, say, 16K columns by 16K rows, the size of the pointer (without taking into consideration the header portion) can be calculated as follows: any X address contains 15 bits, any Y address has 3 bits. The pointer has 2×(8×15+7×18+1+15)=524 bits, or 3.2% of the (non-pointer) array size. The two X decoders attached to the pointers take another 3.05%. Thus, in this example the total area overhead is 6.25% of the main array.

As described above, during read, the time to obtain the translated address is relatively short. Since the pointer preferably uses binary storage, programming the pointer is faster than programming the multi-state main array, and as it can be programmed in parallel with the main array, there is no time penalty. The buffer and the left/right half pointer arrangement, plus the simultaneous existence of "old" and "new" sectors that share the same address, provide at least one level of "undo" operation, useful for aborted programming cycles. Thus, the "make before break" feature follows with no copy operation being necessary. Additionally, because programming takes place on always available erased sectors, write performance can be greatly improved. The random selection of erased sectors, as described in the next section, is good for wear leveling.

Algorithm for Finding Erased Sectors

According to one aspect of the present invention, new data corresponding to a logical address is written to an open physical address other than that which previously corresponded to the logical address. The open physical address can either be previously unused or a previously used address that has been erased, for example in a background erase process. In a pointer based architecture of a flash memory array, finding erased sectors, randomly, from the available erase pool, with a relatively minimum delay, will improve performance.

In an exemplary embodiment of this task, each sector has a special "erase bar" flag bit to signal its status, as shown in column 321 and 323 in the example of FIGS. 3a-f. While the ability of reading many flag bits in parallel is of great help, it is not mandatory. A random search seed, in the form of an X address, is generated by querying a digital counter. The counter's maximum count equals the number of rows permanently ON, such as 7 in the example of FIGS. 3a-f. Starting from the seed address, the flag bits of different rows are checked, preferable in the same, optimized, sequence. In this way, even though the checking algorithm is not necessarily random, the outcome of the operation will be a random erased sector, if many are available, granted by the random initiation. Although the speed of finding an erased sector decreases with the size of the available pool, a maximum number of steps can be guaranteed if multiple rows are checked in parallel.

When the memory array is partitioned into segments with a common source/drain connection between adjacent cells (a "virtual ground" architecture) in a NOR fashion, an erased row will be conducting. By applying a signal to one end of a number of rows at once, if any one of them is conducting, and therefore erased, a current will result at a bit line connected to other end, allowing the sectors to be tested simultaneously to determine if one or more in the group is erased. This way, a pure binary search requires no more than K steps to signal the first segment out of $2^K$ to find at least one erased row. Although spreading this binary search over the whole memory will provide the fastest way to find the desired segment, current consumption considerations may limit the size of the checked array. Accordingly, linear and binary search can be combined.

After finding a segment that contains at least one erased sector, a pure binary search can pin it down inside. As an example, if the memory has 16K rows divided in 256 segments of 64 rows each, blocks of 16 segments can be linearly searched in 16 sequences, followed by four binary searches within a block. The number of steps required to find a segment is then 16+4=20 steps. With 6 more steps to find the row within the segment, the total number of steps is 26. For a read cycle of 100 ns, 2.6 μs are needed, which is not a very big time overhead for a write cycle that typically requires hundreds of micro-seconds.

As erased rows are conducting; their erase bar bit is naturally 0. All the rows that have a non-conducting erase bar bit will automatically be excluded from the erase pool search when checked either in parallel or individually.

Row Redundancy in a Pointer Organized Architecture

In non-volatile memory systems, it is common to map out bad rows and sectors by storing their addresses somewhere and comparing any presented address with that list, then generating the spare location code if necessary. This is described, for example in U.S. Pat. No. 5,602,987, which is incorporated by reference above. In the pointer based environment of the present invention, since the pointers themselves constitute a translation map, the mapping out operation can be moved to the pointer encoding level.

Because erased sectors can be assigned by automatic search at programming time as describe in the previous section, bad sectors should be excluded from the erase pool. This can happen automatically if due to a defect a sector fails by having the word line shorted to ground. In this case any bit, including the erase bar bit, will show up as "1". Alternately, if the sector fails, but the word line is not shorted to ground, there is chance that the erase bar bit can be programmed at sort. If the erase bar bit itself is un-programmable, the whole segment can be recorded as "bad" in a ROM portion of the array or other specially assigned area of the memory. At power up, the ROM is read and a latch inside the segment will be set to mark it bad. For such a case, the latch will keep the segment select at "0" so that all sectors within that segment appear programmed. This way, they do not participate in the search sequence.

While the above cases are easily handled, the worst scenario will require "very stubborn" sectors, that is difficult to program or erase sectors, to be recorded on a list on a specially assigned row. At power up, the list can dumped into a RAM to be consulted, so that a potential winner in the erase search can be vetoed if it is on the list. That particular address can then become the seed for the next erased sector search.

For the pointers themselves, the arrangement into two physically different halves on opposite sides of the array will generally result in the existence of, at least, one good half of the pointer. In the extremely unlikely event of matching bad sectors on both halves, the die can be sorted out with practically no yield loss.

The bad sectors, on the bad half of the pointer, will follow, more or less, the same philosophy as normal rows. However, the requirement for such a bad pointer sector is to present either a 00 . . . 000 or a 11 . . . 111 code at the fuse address position if the flag bit is stuck "1". The good half of a bad pointer will encode the spare address at the fuse position, while being flagged as active. All the good pointers will have, on the active half, their own address encoded at the fuse position.

As mentioned above, although the discussion so far has referred mainly to embodiments using a charge storing device, such as floating gate EEPROM or FLASH cells, for the memory device, it can be applied to other embodiments, including magnetic and optical media. As the particulars of how the storage elements are read, are written, and store data do not enter into the main aspects of the present invention, the various aspects of the present invention may be applied to other memory types, including, but not limited to, sub 0.1 um transistors, single electron transistors, organic/carbon based nano-transistors, and molecular transistors. For example, NROM and MNOS cells, such as those respectively described in U.S. Pat. No. 5,768,192 of Eitan and U.S. Pat. No. 4,630, 086 of Sato et al., or magnetic RAM and FRAM cells, such as those respectively described in U.S. Pat. No. 5,991,193 of Gallagher et al. and U.S. Pat. No. 5,892,706 of Shimizu et al., all of which are hereby incorporated herein by this reference, could also be used.

Although the various aspects of the present invention have been described with respect to specific embodiments, it will be understood that the invention is protected within the full scope of the appended claims.

I claim:

1. A non-volatile memory system, comprising:
   a controller for externally transferring data identified by logical sector addresses; and
   a memory connectable to the controller, the memory having an array including:
      a non-volatile data storage portion having a plurality of sectors for storing user data, wherein each sector contains a plurality of data storage elements and is identified by a physical address; and
      a first pointer structure area formed along a first side of the array for storing correspondences between logical sector addresses and physical sector addresses,
   wherein the controller and memory on separate integrated circuits and the memory system transfers data between the controller and the memory based on logical sector addresses and converts logical sector addresses into a corresponding physical sector addresses on the memory using the pointer structure, and wherein the data storage portion and the first pointer structure have a common column decoder structure and distinct row decoder structures.

2. The non-volatile memory system of claim 1, wherein the first pointer structure includes a fuse structure indicating whether the first pointer structure is bad.

3. The non-volatile memory system of claim 1, wherein the first pointer structure includes header information.

4. The non-volatile memory system of claim 3, wherein the header information includes ECC information.

5. The non-volatile memory system of claim 1, wherein said correspondences are stored in binary non-volatile storage elements and the data storage elements are multi-state.

6. A non-volatile memory system comprising:
   a controller for externally transferring data identified by logical sector addresses; and
   a memory connectable to the controller, the memory having an array including:
      a non-volatile data storage portion having a plurality of sectors for storing user data, wherein each sector contains a plurality of data storage elements and is identified by a physical address; and
      a first pointer structure area formed along a first side of the array for storing correspondences between logical sector addresses and physical sector addresses,
   wherein the memory system transfers data between the controller and the memory based on logical sector addresses and converts logical sector addresses into a corresponding physical sector addresses on the memory using the pointer structure, and further comprising
      a second pointer structure area for storing correspondences between logical sector addresses and physical sector addresses formed on a portion of the array non-adjacent to the first pointer structure
   wherein the first and second pointer structure each include a flag bit indicating which of the pointer structures is currently active.

7. The non-volatile memory system of claim 6, wherein the second pointer structure is formed along a second side of the array, the first and second sides being on opposite sides of the data storage portion.

8. The non-volatile memory system of claim 6, wherein the first and second pointer structures have distinct row decoders.

9. A non-volatile memory system comprising:
   a controller for externally transferring data identified by logical sector addresses; and
   a memory connectable to the controller, the memory having an array including:
      a non-volatile data storage portion having a plurality of sectors for storing user data, wherein each sector contains a plurality of data storage elements and is identified by a physical address; and
      a first pointer structure area formed along a first side of the array for storing correspondences between logical sector addresses and physical sector addresses,
   wherein the memory system transfers data between the controller and the memory based on logical sector addresses and converts logical sector addresses into a corresponding physical sector addresses on the memory using the pointer structure, and
   wherein the data storage portion includes a plurality of planes and the pointer stores a number of row addresses equal to the number of planes for each correspondence.

10. A non-volatile memory system, comprising:
    a controller for externally transferring data identified by logical sector addresses; and
    a memory connectable to the controller, the memory having an array including:
       a non-volatile data storage portion having a plurality of sectors for storing user data, wherein each sector contains a plurality of data storage elements and is identified by a physical address; and
       a first pointer structure area formed along a first side of the array for storing correspondences between logical sector addresses and physical sector addresses,
    wherein the controller and memory on separate integrated circuits and the memory system transfers data between the controller and the memory based on logical sector addresses and converts logical sector addresses into a corresponding physical sector addresses on the memory using the pointer structure, and
    wherein the pointer structure concurrently maintains a first correspondence between a logical sector address and a first physical sector address at which currently valid data identified by the logical sector address is stored and a second correspondence between the logical sector address and a second distinct physical sector address at which previously valid data identified by the logical sector address has been stored.

* * * * *